US009368571B2

(12) United States Patent
Kaji et al.

(10) Patent No.: US 9,368,571 B2
(45) Date of Patent: Jun. 14, 2016

(54) TRENCH ISOLATION STRUCTURE HAVING ISOLATING TRENCH ELEMENTS

(71) Applicant: LAPIS SEMICONDUCTOR CO., LTD., Yokohama (JP)

(72) Inventors: Takao Kaji, Miyazaki (JP); Katsuhito Sasaki, Miyazaki (JP); Takaaki Kodaira, Miyazaki (JP); Yuuki Doi, Miyazaki (JP); Minako Oritsu, Miyazaki (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/683,154

(22) Filed: Apr. 10, 2015

(65) Prior Publication Data
US 2015/0214298 A1    Jul. 30, 2015

Related U.S. Application Data

(63) Continuation of application No. 13/910,144, filed on Jun. 5, 2013, now Pat. No. 9,029,980.

(30) Foreign Application Priority Data

Jun. 14, 2012 (JP) ................................. 2012-134999

(51) Int. Cl.
*H01L 21/70* (2006.01)
*H01L 29/66* (2006.01)
(Continued)

(52) U.S. Cl.
CPC ...... *H01L 29/0649* (2013.01); *H01L 21/76224* (2013.01); *H01L 29/0619* (2013.01); *H01L 29/732* (2013.01); *H01L 29/78* (2013.01)

(58) Field of Classification Search
CPC .................... H01L 29/0649; H01L 21/76224; H01L 9/0619; H01L 29/78; H01L 29/732; H01L 29/0692; H01L 29/407; H01L 29/0619
USPC ................ 257/510, 506, 331, 330, 334, 355, 257/E21.586, E27.009, E29.257; 438/424, 438/270, 329, 667
See application file for complete search history.

(56) References Cited

U.S. PATENT DOCUMENTS 5,448,102 A   9/1995  Gaul et al.
5,683,075 A  11/1997  Gaul et al.
(Continued)

FOREIGN PATENT DOCUMENTS

JP    H04-263454 A    9/1992
JP    2001-199191     7/2001
(Continued)

OTHER PUBLICATIONS

Japanese Office Action dated Mar. 8, 2016.

*Primary Examiner* — Long K Tran
*Assistant Examiner* — Dzung Tran
(74) *Attorney, Agent, or Firm* — Voletine & Whitt, PLLC

(57) ABSTRACT

A semiconductor device includes a semiconductor substrate, an element isolating trench structure that includes an element isolating trench formed in one main surface of the semiconductor substrate, an insulating material that is formed within the element isolating trench, element formation regions that are surrounded by the element isolating trench, and semiconductor elements that are respectively formed in the element formation regions. The element isolating trench includes first element isolating trenches extending in a first direction, second element isolating trenches extending in a second direction that are at a right angle to the first direction, and third element isolating trenches extending in a third direction inclined at an angle θ (0°<θ<90°) from the first direction.

4 Claims, 11 Drawing Sheets

(51) Int. Cl.
*H01L 23/62* (2006.01)
*H01L 21/336* (2006.01)
*H01L 29/06* (2006.01)
*H01L 21/762* (2006.01)
*H01L 29/732* (2006.01)
*H01L 29/78* (2006.01)

(56) References Cited

U.S. PATENT DOCUMENTS

| | | | |
|---|---|---|---|
| 6,168,996 B1 | 1/2001 | Numazawa et al. | |
| 6,667,531 B1* | 12/2003 | Ireland | H01L 21/76224 257/510 |
| 7,745,902 B1 | 6/2010 | Foote | |
| 8,357,989 B2 | 1/2013 | Onishi et al. | |
| 2005/0282347 A1* | 12/2005 | Davies | H01L 21/764 438/329 |
| 2007/0020926 A1 | 1/2007 | Kalvesten et al. | |
| 2007/0148947 A1 | 6/2007 | Davies | |
| 2009/0079002 A1* | 3/2009 | Lee | H01L 29/66712 257/355 |
| 2010/0032750 A1* | 2/2010 | Davies | H01L 21/76224 257/329 |
| 2010/0140696 A1* | 6/2010 | Yedinak | H01L 29/0692 257/334 |
| 2012/0049320 A1 | 3/2012 | Parsey, Jr. et al. | |

FOREIGN PATENT DOCUMENTS

| | | |
|---|---|---|
| JP | 2003-303830 | 10/2003 |
| JP | 2009-164609 | 7/2009 |
| JP | 2011-066067 A | 3/2011 |

* cited by examiner

TRENCH ISOLATION STRUCTURE HAVING ISOLATING TRENCH ELEMENTS

CROSS-REFERENCE TO RELATED APPLICATION

This application is a continuation application of application Ser. No. 13/910,144 filed on Jun. 5, 2013, now U.S. Pat. No. 9,029,980, which claims priority under 35 USC 119 to Japanese Patent Application No. 2012-134999 filed on Jun. 14, 2012, the disclosures of which are incorporated by reference herein.

BACKGROUND

1. Technical Field

The present invention relates to a semiconductor device and a method of manufacturing the same, and more particularly, relates to a semiconductor device including an element isolating trench structure and a method of manufacturing the same.

2. Related Art

Various semiconductor devices including element isolating trench structures are proposed (see Japanese Patent Application Laid-Open (JP-A) Nos. 2009-164609, 2003-303830 and 2001-199191).

The present inventors have found that there is the following problem as a result of intensively investigating the semiconductor devices including such element isolating trench structures. That is, when such an element isolating trench structure is arranged to be of two-dimensionally high density, it has been found that there is a problem in that a crack is generated at the outermost circumference portion of the trench structure which is high densely arranged.

SUMMARY

According to an aspect of the present invention, there is provided a semiconductor device including:

a semiconductor substrate;

an element isolating trench structure that includes an element isolating trench formed in one main surface of the semiconductor substrate;

an insulating material that is formed within the element isolating trench;

element formation regions that are surrounded by the element isolating trench; and semiconductor elements that are respectively formed in the element formation regions, wherein the element isolating trench includes first element isolating trenches extending in a first direction, second element isolating trenches extending in a second direction that are at a right angle to the first direction, and third element isolating trenches extending in a third direction inclined at an angle θ (0°<θ<90°) from the first direction.

According to another aspect of the present invention, there is provided a semiconductor device including:

a semiconductor substrate;

an element isolating trench that is formed in one main surface of the semiconductor substrate;

an insulating material that is formed within the element isolating trench;

an element formation region that is surrounded by the element isolating trench; and a semiconductor element that is formed in the element formation region, wherein a gap is formed in the insulating material within the element isolating trench.

According to still another aspect of the present invention, there is provided a method of manufacturing a semiconductor device including:

forming an element isolating trench in one main surface of a semiconductor substrate;

forming an insulating material, having a gap, within the element isolating trench; and thereafter forming a semiconductor element in an element formation region surrounded by the element isolating trench.

BRIEF DESCRIPTION OF THE DRAWINGS

Exemplary embodiments of the present invention will be described in detail based on the following figures, wherein.

DETAILED DESCRIPTION OF THE INVENTION

Hereinafter, preferred embodiments of the present invention will be described with reference to the accompanying drawings.

(First Embodiment)

Figure 1:
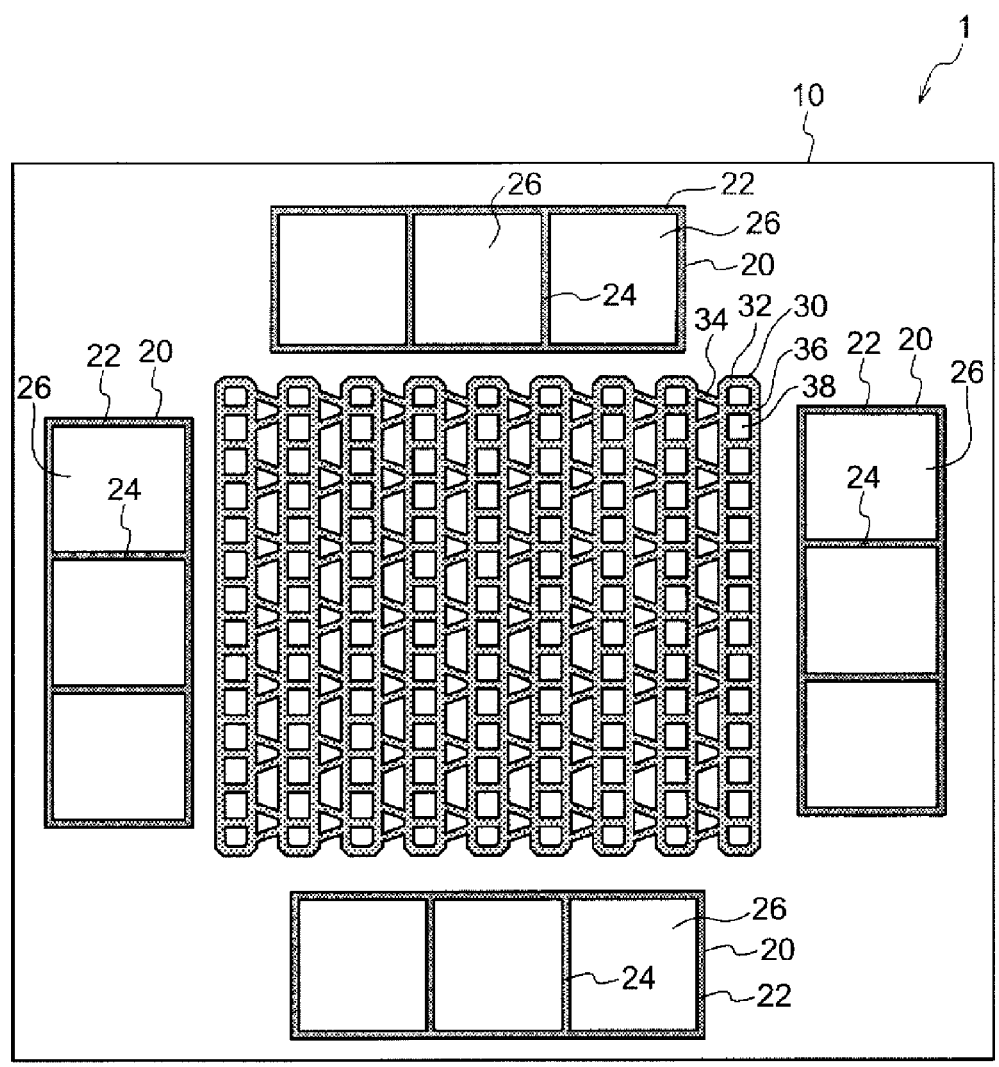
FIG. 1 is a schematic plan view for explaining a semiconductor device according to a first embodiment of the present invention.
Figure 1:
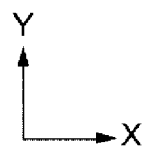

Referring to FIG. 1, in a semiconductor device 1 according to first and second preferred embodiments of the present invention, element isolating trench structures 20 for an I/O element are respectively provided at four sides of the peripheral portion of a semiconductor chip 10, and an element isolating trench structure 30 is provided in the central portion thereof. In the element isolating trench structure 20, a region surrounded by an element isolating trench 22 serves as an element formation region 26 for an I/O element. An element isolating trench 24 located between the element formation regions 26 adjacent to each other is shared by the element formation regions 26 adjacent to each other. The element isolating trench structure 20 is used for an I/O element, and thus the element formation region 26 is larger than the element formation region of the element isolating trench structure 30 located in the central portion.

Figure 2:
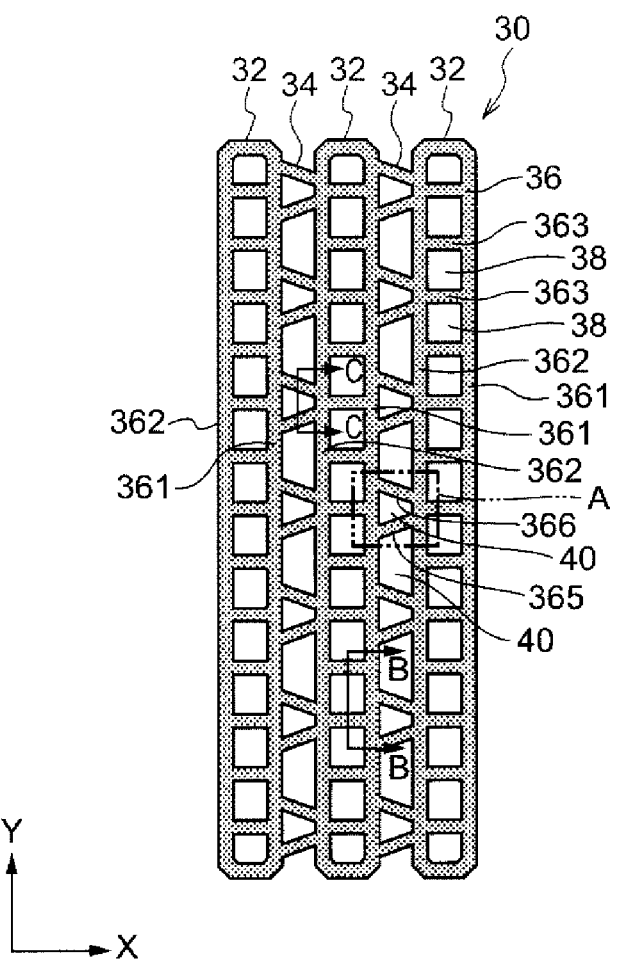
FIG. 2 is a schematic partially enlarged view of FIG. 1.

Referring to FIGS. 1 and 2, an element formation region 38 of the element isolating trench structure 30 located in the central portion is smaller than the element formation region 26 of the element isolating trench structure 20 for an I/O element, and the element formation regions 38 disposed collectively are densely packed. In the element isolating trench structure 30, an element isolating trench structure 32 and an element isolating trench structure 34 are alternately disposed.

Referring to FIG. 2, an element isolating trench 36 of the element isolating trench structure 32 includes element isolating trenches 361 and 362 extending in a Y direction, and an element isolating trench 363 extending in an X direction. Meanwhile, the X direction and the Y direction are at a right angle to each other. A region surrounded by the element isolating trenches 361 and 362 and the element isolating trenches 363 and 363 serves as the element formation region 38. The element isolating trench 363 located between the element formation regions 38 adjacent to each other is shared by the element formation regions 38 adjacent to each other. In the element isolating trench structure 32, the element formation regions 38 are arranged parallel in a line in the Y direction.

An element isolating trench 36 of an element isolating trench structure 34 includes element isolating trenches 361 and 362 extending in a Y direction, an element isolating trench 365 inclined at an angle θ counterclockwise from a X direction, and an element isolating trench 366 inclined at an angle θ clockwise (angle −θ counterclockwise) from the X direction. A region surrounded by the element isolating trenches 361 and 362 and the element isolating trenches 365 and 366 serves as an element formation region 40. The element isolating trench 365 or the element isolating trench 366 located between the element formation regions 40 adjacent to each other is shared by the element formation regions 40 adjacent to each other. In the element isolating trench structure 34, the element formation regions 40 are arranged parallel in a line in the Y direction. In addition, an element formation region 38 of an element isolating trench structure 32 and the element formation region 40 of the element isolating trench structure 34 share the element isolating trench 361 or the element isolating trench 362 located between the element formation region 38 and the element formation region 40.

Figure 4:
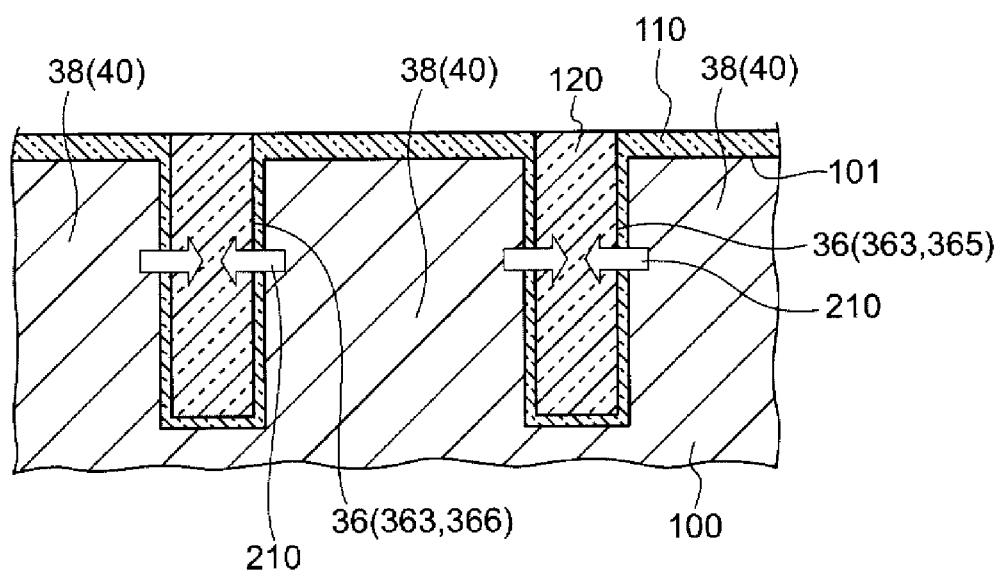
FIG. 4 is a schematic cross-sectional view taken along line BB of FIG. 2.

Referring to FIG. 4, the element isolating trench 36 is formed in one main surface 101 of a silicon substrate 100. The one main surface 101 of the silicon substrate 100 and the side face and the bottom face of the element isolating trench 36 are covered with a silicon oxide film 110 formed by thermal oxidation or the like. A silicon oxide film 120 embedded by a CVD method or the like is formed within the element isolating trench 36 covered with the silicon oxide film 110. After the silicon oxide film 120 is formed on the entirety of the surface by a CVD method or the like, the silicon oxide film 120 on the one main surface 101 of the silicon substrate 100 is removed by performing a planarization process. The dimensions of the element isolating trench 36 have, for example, a depth of equal to or more than 10 μm, a width of approximately 1 μm, and a distance between this element isolating trench 36 and the adjacent one of equal to or more than 2 μm. The dimensions are applicable to the element isolating trenches 361, 362, 363, 365, and 366. FIG. 4 is a schematic cross-sectional view taken along line BB of FIG. 2, but the cross section taken along line CC of FIG. 2 also includes a similar structure. Meanwhile, such a deep trench is used not only for a purpose of element isolation, but also for a purpose of dense disposition below a pad to reduce the capacity between the pad and the substrate.

Figure 3:
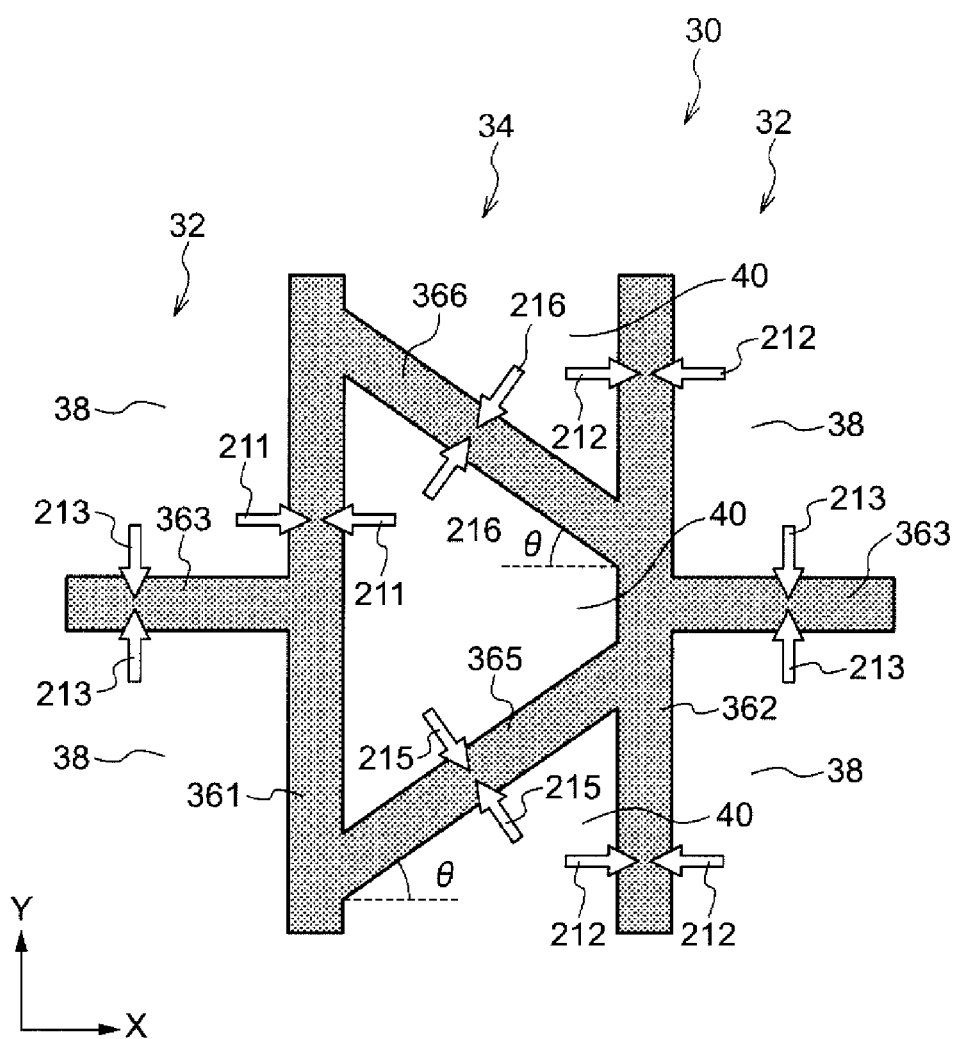
FIG. 3 is a schematic partially enlarged view of part A in FIG. 2.

In such a structure, the silicon oxide film 120 is contracted by heat treatment such as annealing, and thus the silicon substrate 100 receives stress 210 from the silicon oxide film 120. Referring to FIG. 3, in the element isolating trench structure 32, stresses 211 and 212 in the X direction are applied to the element formation region 38 by the element isolating trenches 361 and 362 extending in the Y direction, and stress 213 in the Y direction is applied thereto by the element isolating trench 363 extending in the X direction. In the element isolating trench structure 34, the stresses 211 and 212 in the X direction are applied to the element formation region 40 by the element isolating trenches 361 and 362 extending in the Y direction, stress 215 in a direction inclined at an angle θ clockwise from the X direction is applied thereto by the element isolating trench 365 inclined at an angle θ counterclockwise from the X direction, and stress 216 in a direction inclined at an angle θ counterclockwise from the X direction is applied thereto by the element isolating trench 366 inclined at an angle θ clockwise from the X direction. Therefore, the stresses 211 and 212 in the X direction caused by the element isolating trenches 361 and 362 and the stress 213 in the Y direction caused by the element isolating trench 363 may be dispersed due to the stress 215 caused by the element isolating trench 365 and the stress 216 caused by the element isolating trench 366, and a crack may be prevented from being generated in the silicon substrate due to the concentration of the stresses.

The angle θ may be in a range of 0°<θ<90°, but is preferably 45°. When the angle is 45°, stress may be uniformly dispersed in both the X direction and the Y direction. In addition, the inclinations of the element isolating trench 365 and the element isolating trench 366 are preferably set to be in opposite directions with respect to the X direction (or with respect to the Y direction). This is because the stresses may be dispersed in opposite directions to each other.

Figure 5:
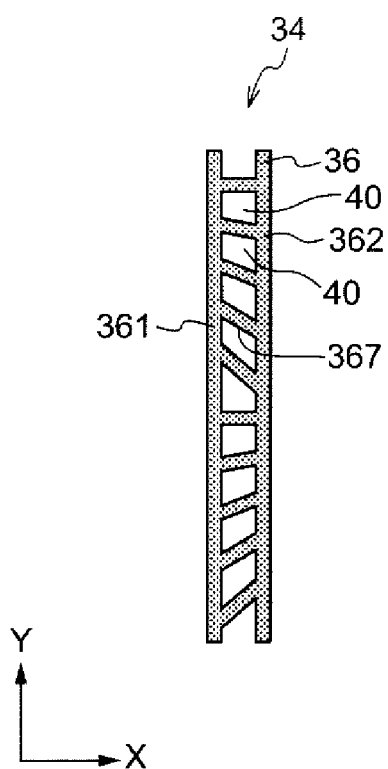
FIG. 5 is a schematic plan view for explaining a modified example of the semiconductor device according to the first embodiment of the present invention.

Meanwhile, the angle θ may not be unified as mentioned above. As illustrated in FIG. 5, the inclination of an element isolating trench 367 may change sequentially, the trench 367 being provided between the element isolating trench 361 and the element isolating trench 362 of the element isolating trench structure 34 which extend in the Y direction, and being inclined from the X direction (or Y direction). In the element isolating trench structure 34 illustrated in FIG. 5, the inclination of the element isolating trench 367, as going from the lower side of the paper toward the upper side, sequentially decreases from the inclination at approximately 45° counterclockwise from the X direction and becomes parallel to the X direction. Thereafter, the element isolating trench 367 is inclined at approximately 45° clockwise from the X direction, and then the inclination thereof sequentially decreases and becomes parallel to the X direction.

In addition, an element isolating trench structure in which element isolating trenches inclined from the X direction (or Y direction) are dispersedly arranged within the element isolating trench structure including the element isolating trenches extending in the Y direction and the element isolating trenches extending in the X direction may be used, instead of an element isolating trench structure 30 in which the element isolating trench structure 32 including the element isolating trenches extending in the Y direction and the element isolating trenches extending in the X direction and the element isolating trench structure 34 including the element isolating trenches extending in the Y direction and the element isolating trenches inclined from the X direction (or Y direction) are alternately disposed as in the present embodiment. In this case, in the element isolating trenches inclined from the X direction (or Y direction), the trench inclined at an angle θ of 45° counterclockwise from the X direction and the trench inclined at an angle θ of 45° clockwise from the X direction may be dispersedly arranged. In addition, stress may be dispersed as a whole, and the inclination angles of the element isolating trenches inclined from the X direction (or Y direction) may not be unified.

As in the element formation region 40, a semiconductor element may be disposed in the element formation region in which a portion of the element isolating trench is constituted by the element isolating trench inclined at an angle θ (0°<θ<90°) from the X direction. The corner of the element formation region, however, is rounded, and therefore, when the element formation region is small, it is difficult to dispose the semiconductor element. In the present embodiment, the semiconductor element is disposed in the element formation region 38, and is not disposed in the element formation region 40.

Figure 6:
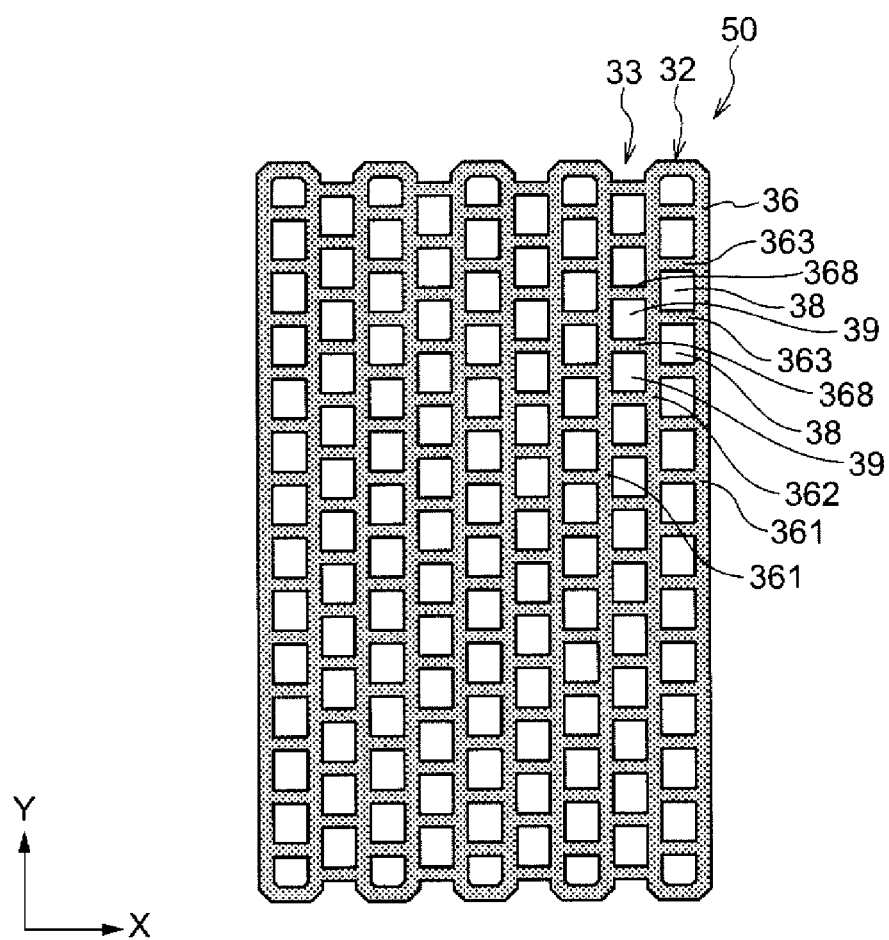
FIG. 6 is a schematic plan view for explaining a semiconductor device for comparison.

Unlike the present embodiment, in an element isolating trench structure 50 as illustrated in FIG. 6, the element isolating trench structure 32 and an element isolating trench structure 33 are alternately disposed. The element isolating trench structure 32 is the same as the element isolating trench structure 32 according to the first embodiment. The element isolating trench 36 of the element isolating trench structure 33 includes the element isolating trenches 361 and 362 extending in the Y direction and an element isolating trench 368 extending in the X direction. A region surrounded by the element isolating trenches 361 and 362 and the element isolating trenches 368 and 368 serves as an element formation region 39. The element isolating trench 368 located between the element formation regions 39 adjacent to each other is shared by the element formation regions 39 adjacent to each other. In the element isolating trench structure 33, the element formation regions 39 are arranged parallel in a line in the Y direction. The element formation region 38 of the element isolating trench structure 32 and the element formation region 39 of the element isolating trench structure 33 share the element isolating trench 361 or the element isolating trench 362 located between the element formation region 38 and the element formation region 39. The element isolating trench 363 of the element isolating trench structure 32 and the element isolating trench 368 of the element isolating trench structure 33 are alternately disposed in the Y direction. The element isolating trench 363 and the element isolating trench 361 or the element isolating trench 362 intersect each other in a T-shape, and the element isolating trench 368 and the element isolating trench 361 or the element isolating trench 362 intersect each other in a T-shape. With such a structure having a T-shaped intersection, the embeddability of the element isolating trench in the intersection portion is better than that in a cross-shaped intersection portion.

Figure 7:
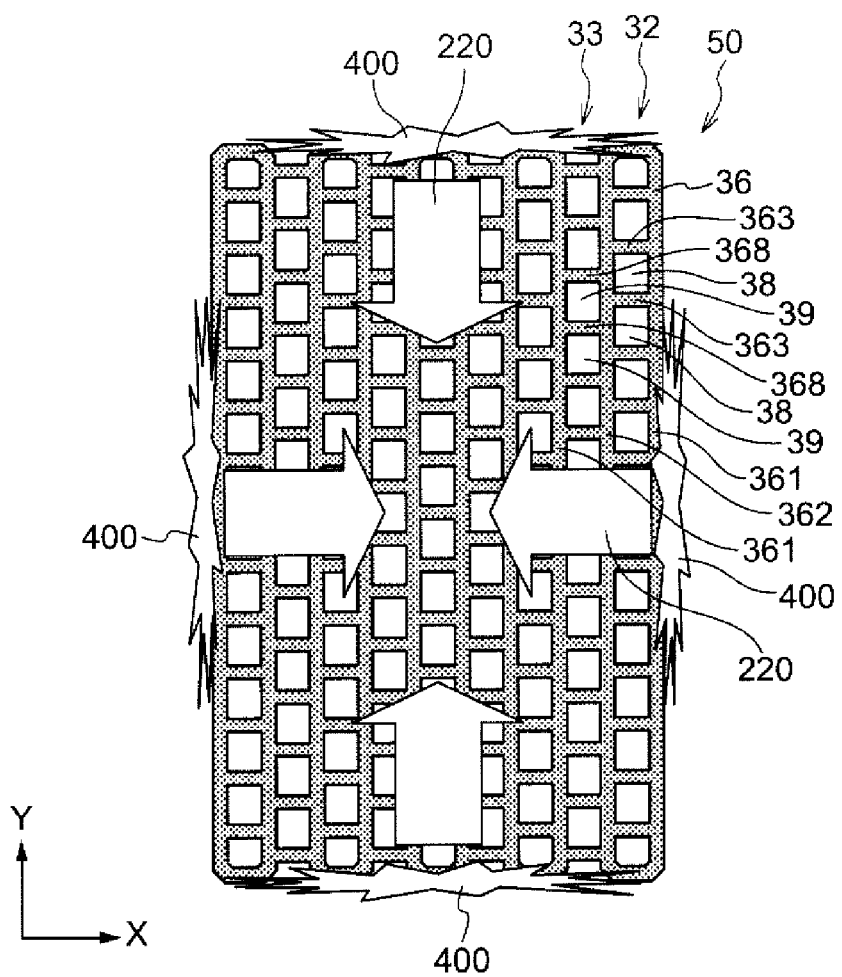
FIG. 7 is a schematic plan view for explaining a problem of the semiconductor device for comparison.

In the element isolating trench structure 50, when a structure is used in which the silicon oxide film 120 embedded by a CVD method or the like is formed in the element isolating trench 36 as illustrated in FIG. 4, the silicon oxide film 120 is contracted by heat treatment such as annealing, and thus the silicon substrate 100 receives the stress 210 from the silicon oxide film 120. Stress in the X direction is applied by the element isolating trenches 361 and 362 extending in the Y direction, and stress in the Y direction is applied by the element isolating trenches 363 and 368 extending in the X direction. The influence of this stress becomes larger as the trenches are densely packed. For this reason, as illustrated in FIG. 7, in the element isolating trench structure 50 densely packed with the element isolating trenches 36, stress 220 reaches a peak at the outermost circumference of the element isolating trench structure 50, and thus a crack 400 is generated at the outermost circumference of the element isolating trench structure 50 in the X direction and the Y direction.

Next, a method of manufacturing a semiconductor device 1 according to the present embodiment will be described. Referring to FIG. 4, the element isolating trench 36 is first formed in one main surface 101 of the silicon substrate 100. Thereafter, the silicon oxide film 110 is formed by thermal oxidation or the like, on the one main surface 101 of the silicon substrate 100 and the side face and the bottom face of the element isolating trench 36. Thereafter, the silicon oxide film 120 is formed on the entirety of the surface by a CVD method or the like. Thereafter, the silicon oxide film 120 on the one main surface 101 of the silicon substrate 100 is removed by performing a planarization process to form a structure in which the silicon oxide film 120 is embedded in the element isolating trench 36 covered with the silicon oxide film 110. Thereafter, a bipolar transistor, a MOS transistor or the like is formed in the element formation region 38.

(Second Embodiment)

Figure 8:
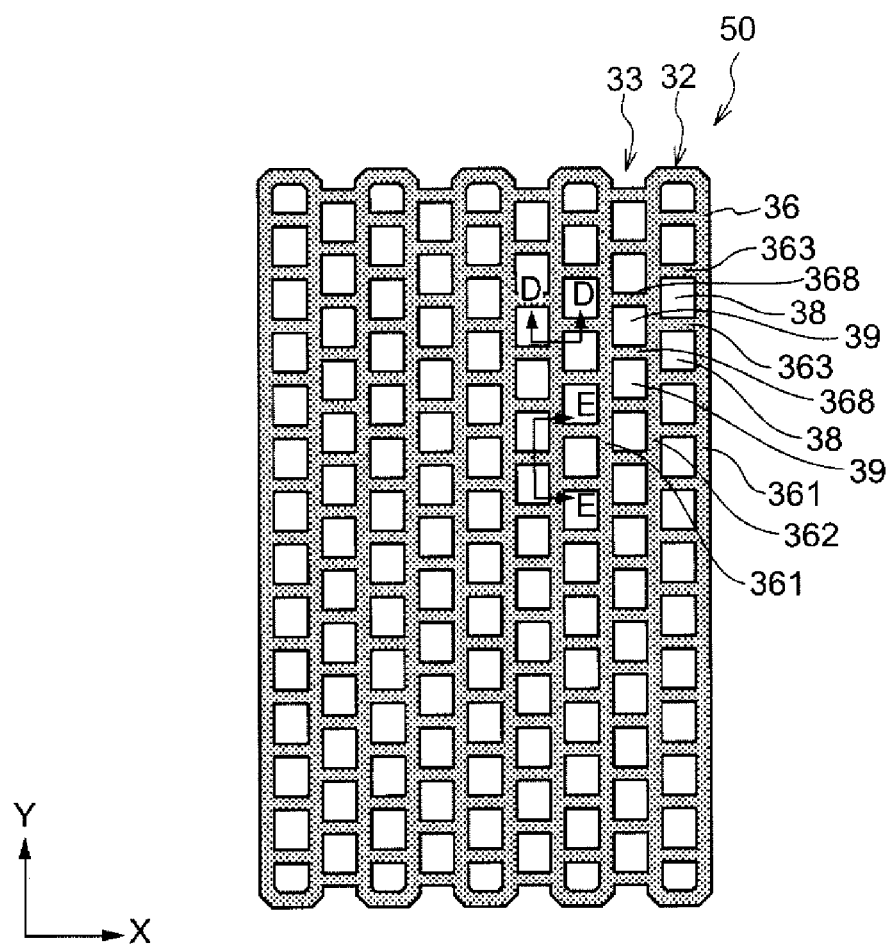
FIG. 8 is a schematic plan view for explaining a semiconductor device according to a second embodiment of the present invention.
Figure 9:
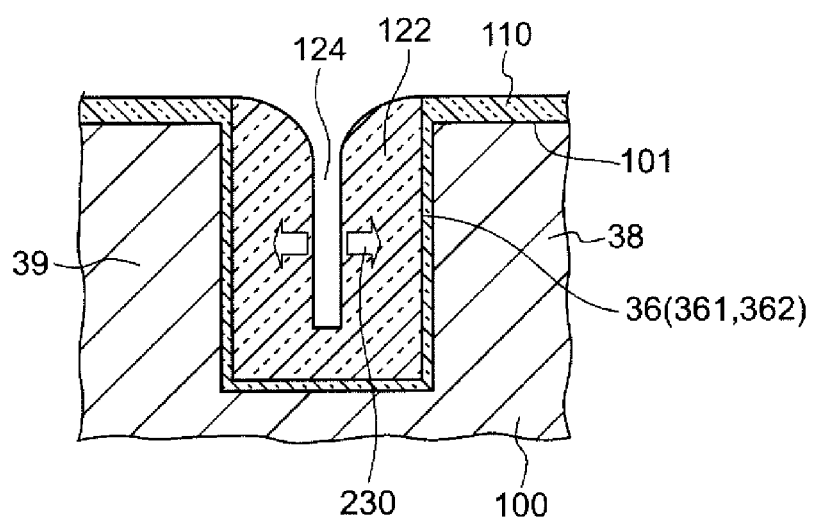
FIG. 9 is a schematic cross-sectional view taken along line DD of FIG. 8.

The planar structure of the element isolating trench structure 50 according to the present embodiment illustrated in FIG. 8 is the same as that in FIG. 6, and thus the description thereof will be omitted. Referring to FIG. 9, the element isolating trench 36 (361, 362) is formed in one main surface 101 of the silicon substrate 100. The one main surface 101 of the silicon substrate 100 and the side face and the bottom face of the element isolating trench 36 are covered with the silicon oxide film 110 formed by thermal oxidation or the like. A silicon oxide film 122 embedded by a CVD method or the like is formed within the element isolating trench 36 covered with the silicon oxide film 110. When the silicon oxide film 122 is formed under the conditions in which the silicon oxide film 120 is embedded in the element isolating trench 36 covered with the silicon oxide film 110 according to the first embodiment, the width of the element isolating trench 36 (361, 362) according to the present embodiment is set to such a width that a gap 124 opened with a width of approximately 0.1 μm is formed in the silicon oxide film 122. Meanwhile, FIG. 9 is a schematic cross-sectional view taken along line DD of FIG. 8, but the cross section taken along line EE of FIG. 8 also includes a similar structure.

Since the silicon oxide film 122 includes the gap 124, the silicon oxide film is contracted in the direction of an arrow 230 by heat treatment such as annealing, without applying stress to the silicon substrate 100. Therefore, as illustrated in FIG. 8, even when the element isolating trench structure 50 densely packed with the element isolating trenches 36 is used, stress resulting from the contraction of the silicon oxide film 122 during heat treatment such as annealing is minimized, and thus a crack may be prevented from being generated. Meanwhile, the gap 124 is embedded with polycrystalline silicon, or an opening of the gap 124 is blocked up, for example, at the time of the formation of gate polycrystalline silicon before a wiring process, in other words, after stress relaxation, and thus there is no influence at the time of the formation of wiring due to a step difference based on the gap 124. That is, the element isolating trench 36 is embedded with different materials such as polycrystalline silicon and the silicon oxide film.

Next, a method of manufacturing a semiconductor device according to the present embodiment will be described. Referring to FIG. 9, the element isolating trench 36 is first formed in one main surface 101 of the silicon substrate 100. Thereafter, the silicon oxide film 110 is formed by thermal oxidation or the like, in the one main surface 101 of the silicon substrate 100 and the side face and the bottom face of the element isolating trench 36. Thereafter, the silicon oxide film 120 is formed on the entirety of the surface by a CVD method or the like. Thereafter, the silicon oxide film 120 on the one main surface 101 of the silicon substrate 100 is removed by performing a planarization process to form a structure in which the silicon oxide film 120 is embedded in the element isolating trench 36 covered with the silicon oxide film 110. At this time, the element isolating trench 36 has a larger width than that of the element isolating trench 36 according to the first embodiment, and the gap 124 is formed in the silicon oxide film 122 within the element isolating trench 36. Thereafter, a bipolar transistor, a MOS transistor or the like is formed in the element formation region 38. Taking an example of a case where a MOS transistor is formed, at the time of the formation of gate polycrystalline silicon, the gap 124 is embedded with polycrystalline silicon, or an opening of the gap 124 is blocked up by polycrystalline silicon.

In the above-mentioned first and second embodiments, a bipolar transistor or a MOS transistor is formed in the element formation regions 38 and 39. Though a description is made by taking an example of the element formation region 38, the same is true of the element formation region 39.

Figure 10:
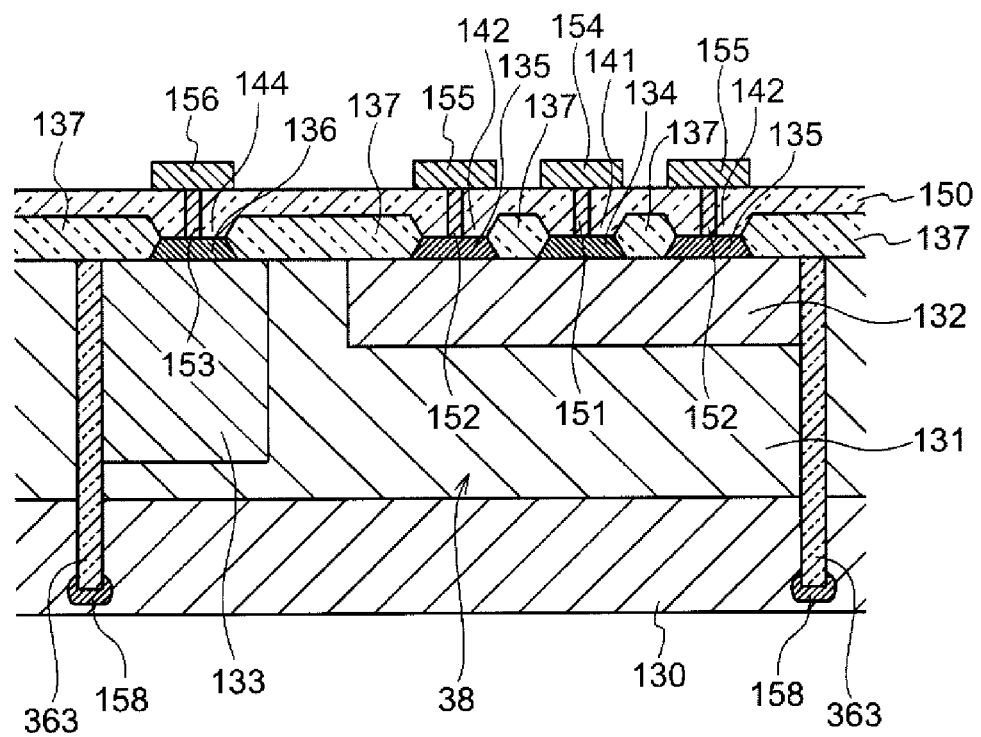
FIG. 10 is a schematic cross-sectional view for explaining a bipolar transistor which is preferably formed in an element formation region, in the semiconductor device according to the first and second embodiment of the present invention.

Referring to FIG. 10, a P⁻ layer 131 is formed on an N⁻ substrate 130. An element isolating trench 363 is formed from the surface of the P⁻ layer 131 up to the middle of the N⁻ substrate 130. A channel stopper 158 is formed in the N⁻ substrate 130 below the element isolating trench 363. A region surrounded by the element isolating trenches 363 and 363 and the element isolating trenches 361 and 362 (see FIGS. 2 and 8) serves as the element formation region 38. An N⁻ layer 132 is formed in the surface of the P⁻ layer 131. A P⁻ layer 133 is formed in the P⁻ layer 131 separately from the N⁻ layer 132. A Locos oxide film 137 is formed on the surface of the P⁻ layer 131. Openings 141, 142, and 144 are formed in the Locos oxide film 137. A P⁺ layer 134 is formed on the N⁻ layer 132 exposed to the opening 141. An N⁺ layer 135 is formed on the N⁻ layer 132 exposed to the opening 142. A P⁺ layer 136 is formed on the P⁻ layer 133 exposed to the opening 144. The P⁺ layer 134 functions as an emitter. The N⁻ layer 132 and the N⁺ layer 135 function as a base. The P⁻ layer 133 and the P⁺ layer 136 function as a collector. An interlayer dielectric film 150 is formed on the Locos oxide film 137, the P⁺ layer 134, the N⁺ layer 135 and the P⁺ layer 136. Contacts 151, 152, and 153 which are respectively connected to the P⁺ layer 134, the N⁺ layer 135 and the P⁺ layer 136 are formed in through holes provided in the interlayer dielectric film 150. Metal wirings 154, 155, and 156 which are respectively connected to the contacts 151, 152, and 153 are formed on the interlayer dielectric film 150.

Figure 11:
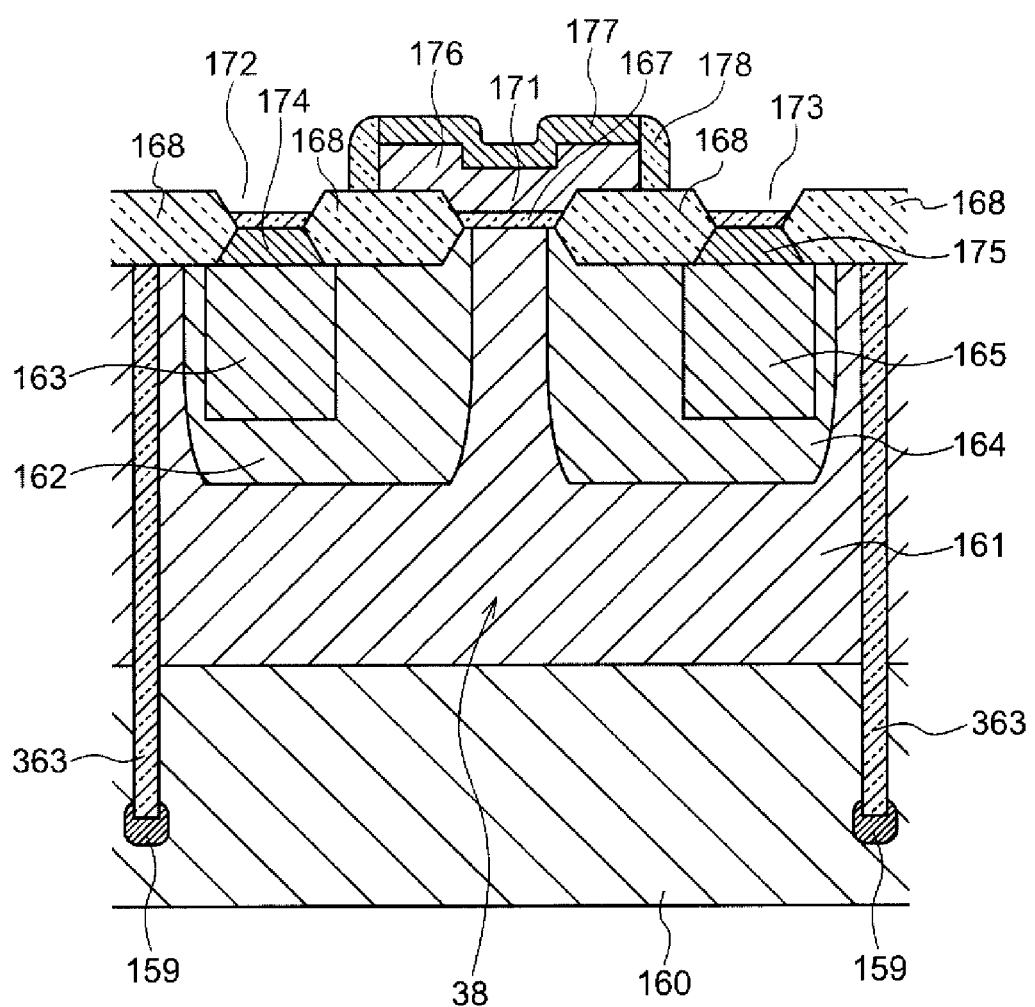
FIG. 11 is a schematic cross-sectional view for explaining a MOS transistor which is preferably formed in the element formation region, in the semiconductor device according to the first and second embodiment of the present invention.

Referring to FIG. 11, an N⁻ layer 161 is formed on a P⁻ substrate 160. An element isolating trench 363 is formed from the surface of the N⁻ layer 161 up to the middle of the P⁻ substrate 160. A channel stopper 159 is formed in the P⁻ substrate 160 below the element isolating trench 363. A region surrounded by the element isolating trenches 363 and 363 and the element isolating trenches 361 and 362 (see FIGS. 2 and 8) serves as the element formation region 38. P⁻ layers 162 and 163 are formed in the surface of the N⁻ layer 161 separately from each other. A P layer 163 is formed in the P⁻ layer 162. A P layer 165 is formed in a P⁻ layer 164. A Locos oxide film 168 is formed on the surface of the N⁻ layer 161. Openings 171, 172, and 173 are formed in the Locos oxide film 168. A gate oxide film 167 is formed on the N⁻ layer 161 exposed to the opening 171. A P⁺ layer 174 is formed on the P layer 163 exposed to the opening 172. A P⁺ layer 175 is formed on the P layer 165 exposed to the opening 173. The P⁻ layer 162, the P layer 163 and the P⁺ layer 174 function as a source. The P⁻ layer 164, the P layer 165 and the P⁺ layer 175 function as a drain. A polycrystalline silicon layer 176 for a gate electrode is formed on the gate oxide film 167, a WSi 177 is formed on the polycrystalline silicon layer 176, and a sidewall 178 is formed on the side faces of the polycrystalline silicon layer 176 and the WSi 177.

As stated above, a variety of typical embodiments of the present invention have been described, but the present invention is not limited to these embodiments. Therefore, the scope of the present invention is intended to be limited only by the following claims.

What is claimed is:

1. A semiconductor device comprising:
   a semiconductor substrate;
   an element isolating trench structure that includes an element isolating trench formed in one main surface of the semiconductor substrate;
   element formation regions; and
   semiconductor elements that are formed in the element formation regions,
   wherein a boundary between a first element formation region from among the element formation regions and the element isolating trench is separated by
   (A) a first side extending in a first direction from a first point,
   (B) a second side extending in a second direction from the first point to a second point, the second direction being inclined at an angle θ (0°<θ<90°) from the first direction, and
   (C) a third side extending in the first direction from the second point,
   wherein the first element formation region is disposed between the first side and the third side, and wherein
   a boundary between a second element formation region from among the element formation regions and the element isolating trench is separated by
   (D) a fourth side facing the second side across the element isolating trench and extending in the second direction, and
   (E) a fifth side being disposed on a line passing through an end point of the fourth side and extending in the first direction.

2. The semiconductor device according to claim 1, further comprising a third element formation region from among the element formation regions,
   wherein a boundary between the third element formation region and the element isolating trench is separated by
   (F) a sixth side facing the first side across the element isolating trench and extending in the first direction, and
   (G) a seventh side extending in a third direction that is at a right angle to the first direction and comes away from the first element formation region.

3. The semiconductor device according to claim 2, wherein the second point is disposed at a portion corresponding to a point between the first point, and an intersection of the sixth side and the seventh side, in the first direction.

4. The semiconductor device according to claim 1, further comprising an eighth side being disposed on a line passing through the first point and extending in the first direction from another end point of the fourth side,
   wherein the second element formation region is disposed between the fifth side and the eighth side.

* * * * *